(12) United States Patent
Lassiter et al.

(10) Patent No.: US 10,297,775 B2
(45) Date of Patent: May 21, 2019

(54) ORGANIC OPTOELECTRONICS WITH ELECTRODE BUFFER LAYERS

(71) Applicant: The Regents of the University of Michigan, An Arbor, MI (US)

(72) Inventors: Brian Lassiter, San Francisco, CA (US); Jeramy D. Zimmerman, Golden, CO (US); Stephen R. Forrest, Ann Arbor, MI (US)

(73) Assignee: The Regents of the University of Michigan, Ann Arbor, MI (US)

(*) Notice: Subject to any disclaimer, the term of this patent is extended or adjusted under 35 U.S.C. 154(b) by 0 days.

(21) Appl. No.: 14/417,893

(22) PCT Filed: Jul. 31, 2013

(86) PCT No.: PCT/US2013/053061
§ 371 (c)(1),
(2) Date: Jan. 28, 2015

(87) PCT Pub. No.: WO2014/022580
PCT Pub. Date: Feb. 6, 2014

(65) Prior Publication Data
US 2015/0207090 A1    Jul. 23, 2015

Related U.S. Application Data

(60) Provisional application No. 61/678,497, filed on Aug. 1, 2012.

(51) Int. Cl.
*B82Y 10/00* (2011.01)
*H01L 51/00* (2006.01)
(Continued)

(52) U.S. Cl.
CPC ............ *H01L 51/442* (2013.01); *B82Y 10/00* (2013.01); *H01L 51/0072* (2013.01);
(Continued)

(58) Field of Classification Search
CPC . H01L 51/4246; H01L 51/444; H01L 51/442; H01L 51/441; H01L 51/0081;
(Continued)

(56) References Cited

U.S. PATENT DOCUMENTS

2005/0186446 A1* 8/2005 Shitagaki ............. C07D 241/42
428/690
2011/0272029 A1* 11/2011 Ihn ...................... H01L 51/4273
136/263

(Continued)

FOREIGN PATENT DOCUMENTS

KR    2012 0029142 A    3/2012
WO    WO 2012/096359 A1    7/2012

OTHER PUBLICATIONS

Forrest S. R. et al., "Strategies for solar energy power conversion using thin film organic photovoltaic cells," Conference Record of the Thirty-First IEEE Photovolatic Specialist Conference (IEEE Cat. No. 05CH37608), Jan. 3, 2005, pp. 23-26.
(Continued)

Primary Examiner — Shaun M Campbell
(74) Attorney, Agent, or Firm — Finnegan, Henderson, Farabow, Garrett & Dunner, LLP

(57) ABSTRACT

There is disclosed an organic optoelectronic device comprising two electrodes in superposed relation comprising an anode and a cathode, at least one donor material and at least one acceptor material located between the two electrodes forming a donor-acceptor heterojunction, an anode buffer layer adjacent to the anode and a cathode buffer layer adjacent to the cathode, and an intermediate layer adjacent to at least one of the anode and cathode buffer layers, wherein when the intermediate layer is adjacent to the anode buffer layer, the intermediate layer is chosen to facilitate the transport of holes to the anode buffer layer, and when the intermediate layer is adjacent to the cathode buffer layer, the
(Continued)

intermediate layer is chosen to facilitate the transport of electrons to the cathode buffer layer. Also disclosed are methods of making the same.

20 Claims, 6 Drawing Sheets

(51) Int. Cl.
  H01L 51/42     (2006.01)
  H01L 51/44     (2006.01)
(52) U.S. Cl.
  CPC ...... *H01L 51/0073* (2013.01); *H01L 51/0081* (2013.01); *H01L 51/0086* (2013.01); *H01L 51/4246* (2013.01); *H01L 51/441* (2013.01); *H01L 51/444* (2013.01); *H01L 51/0046* (2013.01); *H01L 51/0048* (2013.01); *H01L 51/0053* (2013.01); *H01L 2251/301* (2013.01); *H01L 2251/303* (2013.01); *H01L 2251/305* (2013.01); *Y02E 10/549* (2013.01)
(58) Field of Classification Search
  CPC ............. H01L 51/0073; H01L 51/0072; H01L 51/0086; H01L 51/0046; H01L 51/0048; H01L 51/0053; H01L 2251/303; H01L 2251/301; H01L 2251/305; B82Y 10/00; Y02E 10/549
  See application file for complete search history.

(56)         References Cited

U.S. PATENT DOCUMENTS

| 2012/0060910 | A1  | 3/2012 | Schoenfeld et al. |
| 2012/0068123 | A1* | 3/2012 | Sundarraj ............. B82Y 10/00 252/506 |
| 2012/0205615 | A1* | 8/2012 | Seike ................... B82Y 10/00 257/9 |

OTHER PUBLICATIONS

International Search Report and Written Opinion issued in corresponding Application No. PCT/US2013/053061, dated Sep. 18, 2013, 9 pages.

* cited by examiner

ORGANIC OPTOELECTRONICS WITH ELECTRODE BUFFER LAYERS

CROSS-REFERENCE TO RELATED APPLICATION

This application claims the benefit of U.S. Provisional Application No. 61/678,497, filed Aug. 1, 2012, which is incorporated herein by reference in its entirety.

STATEMENT REGARDING FEDERALLY SPONSORED RESEARCH

This invention was made with U.S. Government support under Contract No. FA9550-10-1-0339, awarded by the Air Force Office of Scientific Research and DE-SC0000957 awarded by the U.S. Department of Energy. The government has certain rights in the invention.

JOINT RESEARCH AGREEMENT

The subject matter of the present disclosure was made by, on behalf of, and/or in connection with one or more of the following parties to a joint university-corporation research agreement: University of Michigan and Global Photonic Energy Corporation. The agreement was in effect on and before the date the subject matter of the present disclosure was prepared, and was made as a result of activities undertaken within the scope of the agreement.

The present disclosure generally relates to electrically active, optically active, solar, and semiconductor devices and, in particular, to organic optoelectronic devices comprising at least one buffer layer adjacent to an electrode. Also disclosed herein are methods of preparing the same.

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation, a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes (2) the photovoltage under open circuit conditions, i.e., the open circuit voltage $V_{OC}$, in Volts and (3) the fill factor, FF.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, FF, defined as:

$$FF=\{I_{max}V_{max}\}/\{I_{SC}V_{OC}\} \quad (1)$$

where FF is always less than 1, as $I_{SC}$ and $V_{OC}$ are never obtained simultaneously in actual use. Nonetheless, as FF approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P=FF*(I_{SC}*V_{OC})/P_{inc}$$

To produce internally generated electric fields that occupy a substantial volume of the semiconductor, the usual method is to juxtapose two layers of material with appropriately selected conductive properties, especially with respect to their distribution of molecular quantum energy states. The interface of these two materials is called a photovoltaic junction. In traditional semiconductor theory, materials for forming PV junctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the conduction band minimum and valance band maximum energies, also known as the HOMO-LUMO gap. The Fermi energy characterizes the statistical occupation of molecular quantum energy states denoted by the value of energy for which the probability of occupation is equal to ½. A Fermi energy near the conduction band minimum (LUMO) energy indicates that electrons are the predominant carrier. A Fermi energy near the valence band maximum (HOMO) energy indicates that holes are the predominant carrier. Accordingly, the Fermi energy is a primary characterizing property of traditional semiconductors and the prototypical PV junction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the junction between appropriately selected materials.

The current-voltage characteristics of organic heterojunctions are often modeled using the generalized Shockley equation derived for inorganic diodes. However, since the Shockley equation does not rigorously apply to organic semiconductor donor-acceptor heterojunctions (HJs), the extracted parameters lack a clear physical meaning.

A significant property in organic semiconductors is carrier mobility. Mobility measures the ease with which a charge carrier can move through a conducting material in response to an electric field. In the context of organic photosensitive devices, a layer including a material that conducts preferentially by electrons due to a high electron mobility may be referred to as an electron transport layer, or ETL. A layer including a material that conducts preferentially by holes due to a high hole mobility may be referred to as a hole transport layer, or HTL. In some cases, an acceptor material may be an ETL and a donor material may be an HTL.

Conventional inorganic semiconductor PV cells may employ a p-n junction to establish an internal field. However, it is now recognized that in addition to the establishment of a p-n type junction, the energy level offset of the heterojunction may also play an important role.

The energy level offset at the organic donor-acceptor (D-A) heterojunction is believed to be important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F~$10^6$ V/cm) is low. The most efficient exciton dissociation in organic materials occurs at a D-A interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Organic PV cells have many potential advantages when compared to traditional silicon-based devices. Organic PV cells are light weight, economical in materials use, and can be deposited on low cost substrates, such as flexible plastic foils. Carrier generation requires exciton generation, diffusion, and ionization or collection. There is an efficiency $\eta$ associated with each of these processes. Subscripts may be used as follows: P for power efficiency, EXT for external quantum efficiency, A for photon absorption, ED for diffusion, CC for collection, and INT for internal quantum efficiency. Using this notation:

$$\eta_P \sim \eta_{EXT} = \eta_A * \eta_{ED} * \eta_{CC}$$

$$\eta_{EXT} = \eta_A * \eta_{INT}$$

The diffusion length ($L_D$) of an exciton is typically much less ($L_D$~50 Å) than the optical absorption length (~500 Å), requiring a tradeoff between using a thick, and therefore resistive, cell with multiple or highly folded interfaces, or a thin cell with a low optical absorption efficiency.

Typically in photovoltaic devices, one of the limiting factors for the open-circuit voltage ($V_{OC}$) is the work function ($\phi$) difference between the anode and cathode. For example, many devices use ITO ($\phi_{ITO}$=5.3 eV) and Ag ($\phi_{Ag}$=4.2 eV), which allows $V_{OC}$ as high as 1.1 V. Tao et al. found that when $MoO_3$ is used as an anode buffer layer, the choice of anode work function does not affect $V_{OC}$—using Ag as the anode functioned nearly identically to Au ($\phi_{Au}$=5.2 eV), even though Ag was used as the cathode (Appl. Phys. Lett. 93, 193307 (2008)). In Tao et al.'s device, however, the choice of buffer layer is limited to those that exhibit favorable energy level alignment with the adjacent hole-transporting material. Thus, there is a need to develop new device configurations that allow for increased flexibility in choosing electrode/buffer layers that are appropriate for the specific application of a device.

There is disclosed an organic optoelectronic device comprising two electrodes in superposed relation comprising an anode and a cathode, at least one donor material and at least one acceptor material located between the two electrodes forming a donor-acceptor heterojunction, an anode buffer layer adjacent to the anode and a cathode buffer layer adjacent to the cathode, and an intermediate layer adjacent to at least one of the anode and cathode buffer layers, wherein when the intermediate layer is adjacent to the anode buffer layer, the intermediate layer is chosen to facilitate the transport of holes to the anode buffer layer, and when the intermediate layer is adjacent to the cathode buffer layer, the intermediate layer is chosen to facilitate the transport of electrons to the cathode buffer layer.

In some embodiments of the present disclosure, the anode and cathode buffer layers are independently chosen from transition metal oxides and conductive polymers. In certain embodiments, the anode and cathode buffer layers are independently chosen from transition metal oxides. In certain embodiments, the transition metal oxides are $MoO_3$, $V_2O_5$, $WO_3$, $CrO_3$, $Co_3O_4$, NiO, ZnO, and $TiO_2$. In certain embodiments, the conductive polymers are polyanaline (PANI) and poly(3,4-ethylenedioxythiophene) poly(styrenesulfonate) (PEDOT-PSS).

In some embodiments, the anode and cathode buffer layers comprise the same material. In certain embodiments, the anode and cathode buffer layers comprise the same transition metal oxide. In certain embodiments, the same transition metal oxide is $MoO_3$.

In some embodiments, the intermediate layer is chosen from metals. In certain embodiments, the metals are Ni, Ag, Au, Al, Mg, Pt, Pd, Cu, Ca, Ti, and In.

In some embodiments, the intermediate layer comprises metal nanoparticles, nanoclusters, or nanorods.

In some embodiments, the intermediate layer has a thickness of 5 nm or less.

In some embodiments, the intermediate layer has an average thickness of 1 nm or less.

In some embodiments, the intermediate layer is chosen from transition metal oxides and metals. In certain embodiments, the intermediate layer is chosen from transition metal oxides. In certain embodiments, the transition metal oxides are $MoO_3$, $V_2O_5$, $WO_3$, $CrO_3$, $Co_3O_4$, NiO, ZnO, and $TiO_2$.

In some embodiments, the intermediate layer is adjacent to the anode buffer layer, and the device further comprises a second intermediate layer adjacent to the cathode buffer layer, wherein the second intermediate layer is chosen to facilitate the transport of electrons to the cathode buffer layer.

There is also disclosed an organic optoelectronic device comprising two electrodes in superposed relation comprising an anode and a cathode, at least one donor material and at least one acceptor material located between the two electrodes forming a donor-acceptor heterojunction, at least one buffer layer chosen from an anode buffer layer adjacent to the anode and a cathode buffer layer adjacent to the cathode, and an intermediate layer adjacent to the at least one buffer layer, wherein when the intermediate layer is adjacent to the anode buffer layer, the intermediate layer is chosen to facilitate the transport of holes to the anode buffer layer, and when the intermediate layer is adjacent to the cathode buffer layer, the intermediate layer is chosen to facilitate the transport of electrons to the cathode buffer layer.

In some embodiments, the device further comprises an exciton blocking layer located between at least one of the anode and the donor material and the cathode and the acceptor material. In certain embodiments, the exciton blocking layer comprises a material chosen from BCP, BPhen, NTCDA, PTCBI, TPBi, Ru(acac)3, and Alq2 OPH.

In some embodiments, the two electrodes comprise materials chosen from metals, metal substitutes, conducting oxides, conductive polymers, graphene, and carbon nanotubes. In some embodiments, at least one of the two electrodes is transparent. In one embodiment, the at least one transparent electrode is chosen from transparent conducting oxides and metal or metal substitutes having a thickness sufficient to render it transparent. In certain embodiments, the electrode opposing the transparent electrode is reflective. In one embodiment, the reflective electrode comprises a metal, such as steel, Ni, Ag, Au, Al, Mg, Pt, Pd, Cu, Ca, Ti, and In having a thickness sufficient to render it reflective. In certain embodiments, the electrode opposing the transparent electrode is at least semi-transparent. In one embodiment, the at least semi-transparent electrode is chosen from conducting oxides and metal or metal substitutes having a thickness sufficient to render them at least semi-transparent. Examples of materials that are conducting oxides are indium tin oxide (ITO), indium zinc oxide (IZO), gallium zinc oxide (GZO), and indium gallium zinc oxide (IGZO).

In some embodiments, the two electrodes are at least semi-transparent.

In some embodiments, the two electrodes are reflective

In some embodiments, the anode is transparent and the cathode is reflective. In some embodiments, the cathode is transparent and the anode is reflective.

In certain embodiments, the anode is chosen from conducting oxides. In certain embodiments, the cathode is chosen from metals. In one embodiment, the anode is chosen from conducting oxides and the cathode is chosen from metals. In certain embodiments, the anode is chosen from ITO, gallium indium tin oxide (GITO) and zinc indium tin oxide (ZITO), and the cathode is chosen from Ni, Ag, Al, Mg, and In and mixtures or alloys thereof.

In some embodiments, the at least one donor material comprises a material chosen from phthalocyanines, such as boron subphthalocyanine (SubPc), copper phthalocyanine (CuPc), chloroaluminium phthalocyanine (ClAlPc), tin phthalocyanine (SnPc), zinc phthalocyanine (ZnPc), and other modified phthalocyanines, naphthalocyanines, merocyanine dyes, boron-dipyrromethene (BODIPY) dyes, thiophenes, such as poly(3-hexylthiophene) (P3HT), pentacene, tetracene, diindenoperylene (DIP), and squaraine (SQ) dyes. In certain embodiments the at least one donor material comprises 2,4-bis[4-(N,N-diphenylamino)-2,6-dihydroxyphenyl] squaraine (DPSQ).

In some embodiments, the at least one acceptor material comprises a material chosen from fullerenes (e.g., $C_{60}$ $C_{70}$, $C_{84}$) and functionalized fullerene derivatives (e.g., PCBMs, ICBA, ICMA, etc.), 3,4,9,10-perylenetetracarboxylicbis-benzimidazole (PTCBI), phenyl-C61-butyric-acid-methyl ester ([60]PCBM), phenyl-C71-butyric-acid-Methyl ester ([70]PCBM), thienyl-C61-butyric-acid-methyl ester ([60]ThCBM) and hexadecafluorophthalocyanine ($F_{16}$CuPc). In certain embodiments, the at least one acceptor material comprises $C_{70}$.

In certain embodiments, the at least one donor material comprises SQ, such as DPSQ, the at least one acceptor material comprises fullerene, such as $C_{70}$.

In some embodiments, the device is a photovoltaic device, such as a solar cell.

In other embodiments, the device is a photodetector.

In other embodiments, the device is a photoconductor.

There is also disclosed a method of preparing an organic optoelectronic device comprising depositing a first buffer layer on a first electrode comprising an anode or cathode, depositing at least one donor material and at least one acceptor material over the first buffer layer, depositing a second buffer layer over the donor and acceptor materials, and depositing a second electrode on the second buffer layer, wherein the second electrode is a cathode when the first electrode is an anode, or an anode when the first electrode is a cathode; wherein an intermediate layer is deposited adjacent to at least one of the first and second buffer layers; and wherein the intermediate layer is chosen to facilitate the transport of one of holes and electrons to the adjacent buffer layer.

In some embodiments of the present method, the first and second buffer layers are independently chosen from transition metal oxides and conductive polymers. In certain embodiments, the first and second buffer layers are independently chosen from transition metal oxides. In certain embodiments, the transition metal oxides are $MoO_3$, $V_2O_5$, $WO_3$, $CrO_3$, $Co_3O_4$, $NiO$, $ZnO$, and $TiO_2$. In certain embodiments, the conductive polymers are polyanaline (PANI) and poly(3,4-ethylenedioxythiophene) poly(styrenesulfonate) (PEDOT-PSS).

In some embodiments, the intermediate layer is chosen from metals. In certain embodiments, the metals are Ni, Ag, Au, Al, Mg, Pt, Pd, Cu, Ca, Ti, and In.

In some embodiments, the intermediate layer is chosen from transition metal oxides. In certain embodiments, the transition metal oxides are $MoO_3$, $V_2O_5$, $WO_3$, $CrO_3$, $Co_3O_4$, $NiO$, $ZnO$, and $TiO_2$.

In some embodiments, the intermediate layer is deposited adjacent to the first buffer layer, and the method further comprises depositing a second intermediate layer adjacent to the second buffer layer, wherein the second intermediate layer is chosen to facilitate the transport of one of holes and electrons to the adjacent second buffer layer.

In another disclosed method of preparing an optoelectronic device, the method comprises depositing at least one donor material and at least one acceptor material over a first electrode comprising an anode or cathode, and depositing a second electrode over the donor and acceptor materials, wherein the second electrode is a cathode when the first electrode is an anode, or an anode when the first electrode is a cathode; wherein at least one buffer layer is deposited adjacent to at least one of the anode and cathode; wherein an intermediate layer is deposited adjacent to the at least one buffer layer and is chosen to facilitate the transport of one of holes and electrons to the adjacent buffer layer.

As used and depicted herein, a "layer" refers to a member or component of a photosensitive device whose primary dimension is X-Y, i.e., along its length and width. It should be understood that the term layer is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

As used herein, the expression that a material or component is deposited "over" another material or component permits other materials or layers to exist between the material or component being deposited and the material or component "over" which it is deposited. For example, a buffer layer may be described as deposited "over" donor and acceptor materials, even though there are various materials or layers in between the buffer layer and the donor and acceptor materials.

As used herein, an electrode is said to be "transparent" when it permits at least 50% of the ambient electromagnetic radiation in relevant wavelengths to be transmitted through it. An electrode is said to be "semi-transparent" when it permits some, but less that 50% transmission of ambient electromagnetic radiation in relevant wavelengths.

As used herein, the term "metal" embraces both materials composed of an elementally pure metal, e.g., Mg, and also metal alloys which are materials composed of two or more elementally pure metals, e.g., Mg and Ag together, denoted Mg:Ag. Herein, the term "metal substitute" refers to a material that is not a metal within the normal definition, but which has the metal-like properties that are desired in certain appropriate applications.

Figure 1A:
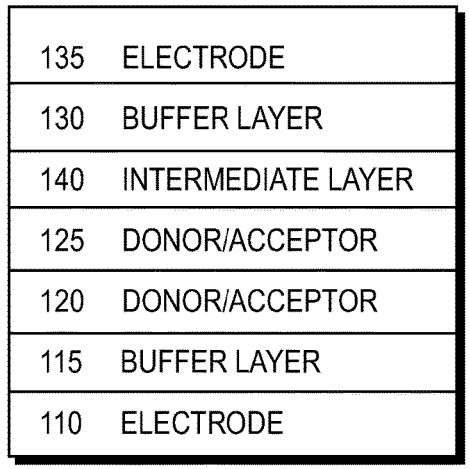
FIG. 1 shows schematics of example optoelectronic devices in accordance with the present disclosure having (a) two buffer layers and one intermediate layer, (b) two buffer layers and two intermediate layers, and (c) one buffer layer and one intermediate layer.
Figure 1B:
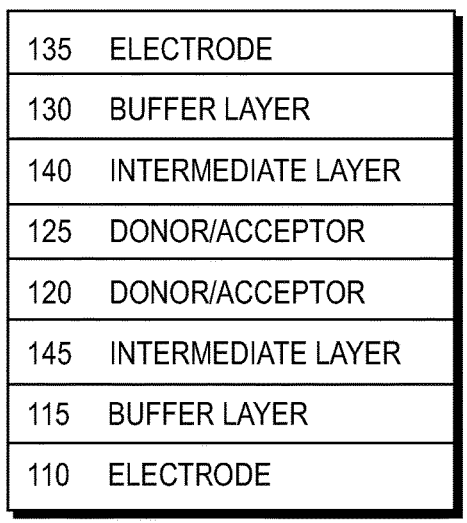
Figure 1C:
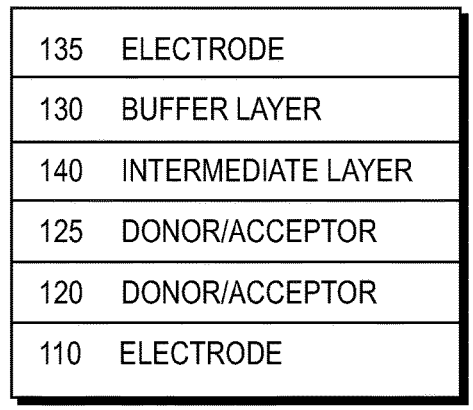

As shown in FIG. 1, the optoelectronic devices of the present disclosure may comprise one or more buffer layers and one or more intermediate layers. For example, there is disclosed an organic optoelectronic device comprising two electrodes in superposed relation comprising an anode and a cathode, at least one donor material and at least one acceptor material located between the two electrodes forming a donor-acceptor heterojunction, at least one buffer layer chosen from an anode buffer layer adjacent to the anode and a cathode buffer layer adjacent to the cathode, and an intermediate layer adjacent to the at least one buffer layer, wherein when the intermediate layer is adjacent to the anode buffer layer, the intermediate layer is chosen to facilitate the transport of holes to the anode buffer layer, and when the intermediate layer is adjacent to the cathode buffer layer, the intermediate layer is chosen to facilitate the transport of electrons to the cathode buffer layer.

There is also disclosed an organic optoelectronic device comprising two electrodes in superposed relation comprising an anode and a cathode, at least one donor material and at least one acceptor material located between the two electrodes forming a donor-acceptor heterojunction, an anode buffer layer adjacent to the anode and a cathode buffer layer adjacent to the cathode, and an intermediate layer adjacent to at least one of the anode and cathode buffer layers, wherein when the intermediate layer is adjacent to the anode buffer layer, the intermediate layer is chosen to facilitate the transport of holes to the anode buffer layer, and when the intermediate layer is adjacent to the cathode buffer layer, the intermediate layer is chosen to facilitate the transport of electrons to the cathode buffer layer.

In accordance with the present disclosure, by employing anode and cathode buffer layers, such as transition metal oxide buffer layers, adjacent to the anode and cathode, respectively, the choice of anode and cathode is arbitrary with respect to work function/energy levels. In addition, the inventors have discovered that by inserting a disclosed intermediate layer adjacent to at least one of the anode and cathode buffer layers, the choice of the adjacent buffer layer is also arbitrary with respect to work function.

In accordance with the present disclosure, the intermediate layer, if adjacent to the anode buffer layer, is chosen to facilitate the transport of holes to the anode buffer layer, and if adjacent to the cathode buffer layer, is chosen to facilitate the transport of electrons to the cathode buffer layer. In accordance with the present disclosure, the intermediate layer may facilitate the respective charge transport by aligning the energy transport levels of an adjacent organic material with the respective buffer layer. An adjacent organic material may be a donor or acceptor material, an electron or hole transporting material, or an exciton-blocking, electron or hole transporting material.

Figure 6:
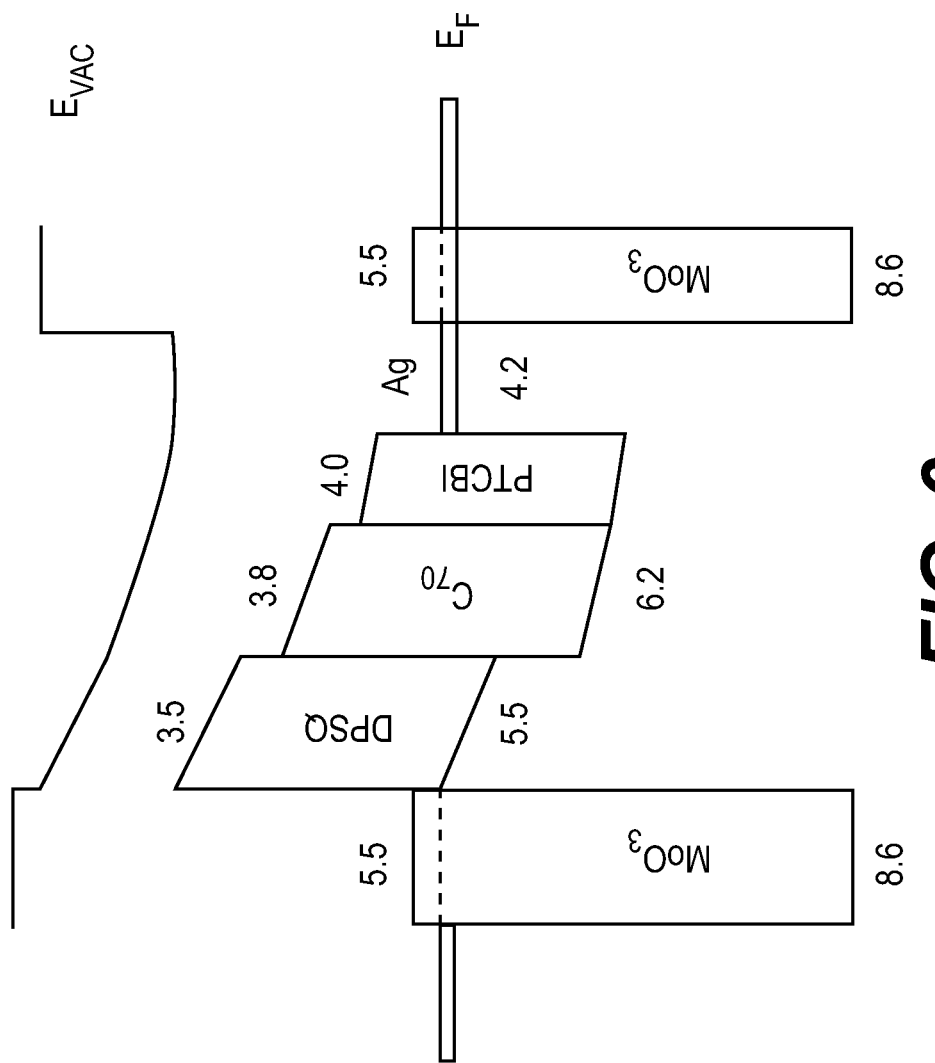
FIG. 6 shows an equilibrium energy level diagram depicting the energy level alignment of intermediate layer Ag and cathode buffer layer $MoO_3$.

As a non-limiting example of the aligning effect of the intermediate layer, FIG. 6 shows an equilibrium energy level diagram depicting the energy level alignment of intermediate layer Ag and cathode buffer layer $MoO_3$. The top line is the vacuum level shift, which denotes the shift when the energy levels in two materials, (e.g., Ag and $MoO_3$) shift to align.

In some embodiments, the intermediate layer is chosen with a work function to align with the highest occupied molecular orbital (HOMO) of an adjacent organic material to facilitate the transport of holes to the anode buffer layer. In some embodiments, the intermediate layer is chosen with a work function to align with the lowest unoccupied molecular orbital (LUMO) of an adjacent organic material to facilitate the transport of electrons to the cathode buffer layer.

Thus, in accordance with the present disclosure, by using an intermediate layer adjacent to at least one of the anode and cathode buffer layers, the choice of electrode and buffer layer adjacent to the intermediate layer is arbitrary with respect to work function/energy levels. For example, the inventors have discovered that $MoO_3$, which is typically used as an anode buffer layer, can also be used as the cathode buffer layer when used in conjunction with the intermediate layer of the present disclosure, because the intermediate layer will align the energy transport levels of an adjacent organic material with the cathode buffer layer. In addition, organic PVs using an intermediate layer with symmetric electrodes consisting of $Ag/MoO_3$ or $ITO/MoO_3$ functioned comparably to a device with archetypal $ITO/MoO_3$ anode and Ag cathode.

These discoveries suggest a new, flexible design criteria for organic optoelectronic devices wherein electrode/buffer materials may be selected with arbitrary work functions/energy levels. Thus, in accordance with the present disclosure devices can be fabricated with electrode/buffer combinations that are appropriate for the specific application of a device, whether of typical or inverted orientation. That is, suitable anode and cathode combinations can be selected from electrodes that are transparent, semi-transparent, reflective, etc. in order to optimize the performance of the device based upon its specific application.

The anode and cathode buffer layers as disclosed herein may be independently chosen from transition metal oxides and conductive polymers. In certain embodiments, the anode and cathode buffer layers are independently chosen from transition metal oxides. In certain embodiments, the transition metal oxides are $MoO_3$, $V_2O_5$, $WO_3$, $CrO_3$, $Co_3O_4$, NiO, ZnO, and $TiO_2$. In certain embodiments, the conductive polymers are polyanaline (PANI) and poly(3,4-ethylenedioxythiophene) poly(styrenesulfonate) (PEDOT-PSS).

In some embodiments, the intermediate layer is chosen from metals. In certain embodiments, the metals are Ni, Ag, Au, Al, Mg, Pt, Pd, Cu, Ca, Ti, and In.

In some embodiments, the intermediate layer comprises metal nanoparticles, nanoclusters, or nanorods.

In certain embodiments, the intermediate layer has a thickness of 15 nm or less, 10 nm or less, or 5 nm or less. In some embodiments, the intermediate layer has an average thickness of 1 nm or less.

In some embodiments, the intermediate layer is adjacent to the anode buffer layer, and the device further comprises a second intermediate layer adjacent to the cathode buffer layer, wherein the second intermediate layer is chosen to facilitate the transport of electrons to the cathode buffer layer.

In some embodiments, the second intermediate layer is chosen from metals. In certain embodiments, the metals are Ni, Ag, Au, Al, Mg, Pt, Pd, Cu, Ca, Ti, and In.

In some embodiments, the second intermediate layer comprises metal nanoparticles, nanoclusters, or nanorods.

In certain embodiments, the second intermediate layer has a thickness of 15 nm or less, 10 nm or less, or 5 nm or less. In certain embodiments, the second intermediate layer has an average thickness of 1 nm or less.

In addition to being chosen from metals, the intermediate layers may be chosen from transition metal oxides. When a buffer layer is chosen from transition metal oxides, the adjacent intermediate layer should not be the same transition metal oxide.

Non-limiting examples of transition metal oxides as disclosed herein are $MoO_3$, $V_2O_5$, $WO_3$, $CrO_3$, $Co_3O_4$, NiO, ZnO, and $TiO_2$.

In some embodiments, the anode and cathode buffer layers comprise the same material. In certain embodiments, the anode and cathode buffer layers comprise the same transition metal oxide. In certain embodiments, the same transition metal oxide is $MoO_3$.

In some embodiments, the two electrodes comprise materials chosen from metals, metal substitutes, conducting oxides, conductive polymers, graphene, carbon nanotubes. In some embodiments, at least one of the two electrodes comprises a conducting oxide, such as indium tin oxide (ITO), tin oxide (TO), gallium indium tin oxide (GITO), zinc oxide (ZnO), and zinc indium tin oxide (ZITO), or a conductive polymer, such as polyanaline (PANI) or poly(3,4-ethylenedioxythiophene) poly(styrenesulfonate) (PEDOT-PSS). In some embodiments, at least one of the two electrodes comprises a metal, such as Ag, Au, Ti, Sn, and Al. In some embodiments, the anode comprises a conducting oxide. In some embodiments, the anode comprises ITO. In some embodiments, the cathode comprises a metal. In some embodiments, the cathode comprises a metal chosen from Ag, Au, Ti, Sn, and Al.

The optoelectronic devices disclosed herein can be grown or placed on any substrate that provides desired structural properties. Thus, in some embodiments, the device further comprises a substrate. For example, the substrate may be flexible or rigid, planar or non-planar. The substrate may be transparent, translucent or opaque. The substrate may be reflective. Plastic, glass, metal, and quartz are examples of rigid substrate materials. Plastic and metal foils and thin glass are examples of flexible substrate materials. The material and thickness of the substrate may be chosen to obtain the desired structural and optical properties. In some embodiments, the substrate is stainless steel, such as a stainless steel foil (SUS). SUS substrates are relatively low cost compared to conventional materials, and provide better heat sinks during growth of layers.

In accordance with the present description, the optoelectronic devices, such as organic PVs, may have a conventional or inverted structure. Examples of inverted device structures are disclosed in U.S. Patent Publication No. 2010/0102304, which is incorporated herein by reference for its disclosure of inverted device structures.

With regard to donor materials that may be used in the present disclosure, non-limiting mention is made to those chosen from phthalocyanines, such as boron subphthalocyanine (SubPc), copper phthalocyanine (CuPc), chloroaluminium phthalocyanine (ClAlPc), tin phthalocyanine (SnPc), zinc phthalocyanine (ZnPc), and other modified phthalocyanines, naphthalocyanines, merocyanine dyes, boron-dipyrromethene (BODIPY) dyes, thiophenes, such as poly(3-hexylthiophene) (P3HT), pentacene, tetracene, diindenoperylene (DIP), and squaraine (SQ) dyes.

Non-limiting embodiments of the squaraine donor material that may be used are those chosen from 2,4-bis[4-(N,N-dipropylamino)-2,6-dihydroxyphenyl] squaraine, 2,4-bis[4-(N,N-diisobutylamino)-2,6-dihydroxyphenyl] squaraine, 2,4-bis[4-(N,N-diphenylamino)-2,6-dihydroxyphenyl] squaraine (DPSQ) and salts thereof. Examples of suitable squaraine materials are disclosed in U.S. Patent Publication No. 2012/0248419, which is incorporated herein by reference for its disclosure of squaraine materials.

In one embodiment, the donor materials may be doped with a high mobility material, such as one that comprises pentacene or metal nanoparticles.

Examples of acceptor materials that may be used in the present disclosure include polymeric or non-polymeric perylenes, polymeric or non-polymeric naphthalenes, and polymeric or non-polymeric fullerenes. Non-limiting mention is made to those chosen from fullerenes (for example, $C_{60}$, $C_{70}$, $C_{84}$) and functionalized fullerene derivatives (e.g., PCBMs, ICBA, ICMA, etc.), 3,4,9,10-perylenetetracarboxylicbis-benzimidazole (PTCBI), Phenyl-$C_{61}$-Butyric-Acid-Methyl Ester ([60]PCBM), Phenyl-$C_{71}$-Butyric-Acid-Methyl Ester ([70]PCBM), Thienyl-$C_{61}$-Butyric-Acid-Methyl Ester ([60]ThCBM), and hexadecafluorophthalocyanine ($F_{16}$CuPc).), 3,4,9,10-perylenetetracarboxylicbis-benzimidazole (PTCBI), Phenyl-$C_{61}$-Butyric-Acid-Methyl Ester ([60]PCBM), Phenyl-$C_{71}$-Butyric-Acid-Methyl Ester ([70]PCBM), Thienyl-$C_{61}$-Butyric-Acid-Methyl Ester ([60]ThCBM), and hexadecafluorophthalocyanine ($F_{16}$CuPc).

The at least one donor material and the at least one acceptor material of the present disclosure form at least one donor-acceptor heterojunction. The heterojunction may be formed by a planar, bulk, mixed, hybrid-planar-mixed, or nanocrystalline bulk heterojunction.

The organic optoelectronic device according to the present disclosure may further comprise one or more blocking layers, such as an exciton blocking layer (EBL). With regard to materials that may be used as an exciton blocking layer, non-limiting mention is made to those chosen from bathocuproine (BCP), bathophenanthroline (BPhen), 1,4,5,8-Naphthalene-tetracarboxylic-dianhydride (NTCDA), 3,4,9,10-perylenetetracarboxylicbis-benzimidazole (PTCBI), 1,3,5-tris(N-phenylbenzimidazol-2-yl)benzene (TPBi), tris(acetylacetonato) ruthenium(III) (Ru(acac)$_3$), and aluminum (III)phenolate (Alq$_2$ OPH), N,N'-diphenyl-N,N'-bis-alpha-naphthylbenzidine (NPD), aluminum tris(8-hydroxyquinoline) (Alq$_3$), and carbazole biphenyl (CBP).

In some embodiments, the one or more blocking layers are located between one or both of the anode and the donor material and the cathode and the acceptor material. Examples of blocking layers are described in U.S. Patent Publication Nos. 2012/0235125 and 2011/0012091 and in U.S. Pat. Nos. 7,230,269 and 6,451,415, which are incorporated herein by reference for their disclosure of blocking layers.

The organic optoelectronic devices of the present disclosure may exist as a tandem device comprising two or more subcells. Subcell, as used herein, means a component of the device which comprises at least one donor-acceptor heterojunction. When a subcell is used individually as a photosensitive optoelectronic device, it typically includes a complete set of electrodes. A tandem device may comprise charge transfer material, electrodes, or charge recombination material or a tunnel junction between the tandem donor-acceptor heterojunctions. In some tandem configurations, it is possible for adjacent subcells to utilize common, i.e., shared, electrode, charge transfer region or charge recombination zone. In other cases, adjacent subcells do not share common electrodes or charge transfer regions. The subcells may be electrically connected in parallel or in series.

In some embodiments, the charge transfer layer or charge recombination layer may be chosen from Al, Ag, Au, MoO$_3$, Li, LiF, Sn, Ti, WO$_3$, indium tin oxide (ITO), tin oxide (TO), gallium indium tin oxide (GITO), zinc oxide (ZO), or zinc indium tin oxide (ZITO). In another embodiment, the charge transfer layer or charge recombination layer may be comprised of metal nanoclusters, nanoparticles, or nanorods.

Organic optoelectronic devices of the present disclosure may function, for example, as PV devices, such as solar cells, photodetectors, or photoconductors.

Whenever the organic photosensitive optoelectronic devices described herein function as a PV device, the materials used in the photoconductive organic layers and the thicknesses thereof may be selected, for example, to optimize the external quantum efficiency of the device. Similarly, the thicknesses of the anode and cathode buffer layers can be selected to optimize the external quantum efficiency of the device. For example, appropriate thicknesses can be selected to achieve the desired optical spacing in the device and/or reduce resistance in the device. The thickness of the intermediate layers, for example, may also be optimized to reduce resistance. Whenever the organic photosensitive optoelectronic devices described herein function as photodetectors or photoconductors, the materials used in the photoconductive organic layers and the thicknesses thereof may be selected, for example, to maximize the sensitivity of the device to desired spectral regions.

There is also disclosed a method of preparing an organic optoelectronic device comprising depositing a first buffer layer on a first electrode comprising an anode or cathode, depositing at least one donor material and at least one acceptor material over the first buffer layer, depositing a second buffer layer over the donor and acceptor materials, and depositing a second electrode on the second buffer layer, wherein the second electrode is a cathode when the first electrode is an anode, or an anode when the first electrode is a cathode; wherein an intermediate layer is deposited adjacent to at least one of the first and second buffer layers;

and wherein the intermediate layer is chosen to facilitate the transport of one of holes and electrons to the adjacent buffer layer.

In some embodiments, the intermediate layer is deposited adjacent to the first buffer layer, and the method further comprises depositing a second intermediate layer adjacent to the second buffer layer, wherein the second intermediate layer is chosen to facilitate the transport of one of holes and electrons to the adjacent second buffer layer.

In another disclosed method of preparing an optoelectronic device, the method comprises depositing at least one donor material and at least one acceptor material over a first electrode comprising an anode or cathode, and depositing a second electrode over the donor and acceptor materials, wherein the second electrode is a cathode when the first electrode is an anode, or an anode when the first electrode is a cathode; wherein at least one buffer layer is deposited adjacent to at least one of the anode and cathode; wherein an intermediate layer is deposited adjacent to the at least one buffer layer and is chosen to facilitate the transport of one of holes and electrons to the adjacent buffer layer.

The materials comprising the optoelectronic devices of the present disclosure may be deposited using methods known in the art.

In some embodiments, the organic materials or organic layers, or organic thin films, can be applied via solution processing, such as by one or more techniques chosen from spin-coating, spin-casting, spray coating, dip coating, doctor-blading, inkjet printing, or transfer printing. For molecules which degrade at temperatures lower than the evaporation or sublimation point, solution-processing technique can be used to achieve uniform, high-quality thin films for electronic purposes.

In other embodiments, the organic materials may be deposited using vacuum evaporation, such as vacuum thermal evaporation, organic vapor phase deposition, or organic vapor-jet printing.

The anode and cathode buffer layers and intermediate layers may be deposited, for example, by vacuum evaporation, such as vacuum thermal evaporation, vapor phase deposition techniques, such as OVPD, or by solution processing that utilizes orthogonal solvents to previous and subsequent layers.

Schematics of example organic optoelectronic devices according to the present disclosure are shown in FIG. 1. Electrode 110 comprises an anode or cathode. Electrode 135 comprises a cathode when electrode 110 comprises an anode. Electrode 135 comprises an anode when electrode 110 comprises a cathode. Organic layers 120 and 125 form a donor-acceptor heterojunction as described herein. Organic layer 120 comprises at least one donor material or at least one acceptor material. Organic layer 125 comprises at least one donor material when layer 120 comprises at least one acceptor material. Organic layer 125 comprises at least one acceptor material when layer 120 comprises at least one donor material.

In some embodiments, buffer layers 115 and 130 may be independently chosen from transition metal oxides and conductive polymers as described herein. Buffer layer 115 is an anode buffer layer when electrode 110 is an anode, and is a cathode buffer layer when electrode 110 is a cathode. Similarly, Buffer layer 130 is an anode buffer layer when electrode 135 is an anode, and is a cathode buffer layer when electrode 135 is a cathode. In some embodiments, as in device A, the device includes an intermediate layer 140 adjacent to a buffer layer 130. In some embodiments, as in device B, the device includes two intermediate layers, one adjacent to buffer layer 130 and one adjacent to buffer layer 115.

In some embodiments, as in device C, the device includes only one buffer layer 130, and one intermediate layer 140. In certain embodiments, buffer layer 130 may be chosen from transition metal oxides and conductive polymers, and is an anode buffer layer when electrode 135 is an anode, and is a cathode buffer layer when electrode 135 is a cathode.

Figure 2:
FIG. 2 shows a specific, non-limiting example of a device in accordance with the present disclosure.

As described herein, additional layers may be included, such as blocking layers or transport layers. For example, FIG. 2 is provided as a specific, non-limiting embodiment of the present disclosure. In FIG. 2, the anode buffer layer is $MoO_3$ (20 nm) and the cathode buffer layer is $MoO_3$ (30 nm). The donor material is DPSQ. The acceptor material is $C_{70}$. PTCBI is used as an exciton-blocking, electron-transport layer, and an intermediate layer comprises Ag nanoparticles, nanoclusters, or nanorods. The two electrodes comprising the anode and cathode may be chosen as described herein.

It should be understood that embodiments described herein may be used in connection with a wide variety of other structures. The specific materials and structures described are exemplary in nature, and other materials and structures may be used. Functional organic optoelectronic devices may be achieved by combining the various layers described in different ways, or layers may be omitted entirely, based on design, performance, and cost factors. Additional layers not specifically described may also be included. Materials other than those specifically described may be used. Although the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting.

Other than in the examples, or where otherwise indicated, all numbers expressing quantities of ingredients, reaction conditions, analytical measurements and so forth, used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches.

Notwithstanding that the numerical ranges and parameters setting forth the broad scope of the disclosure are approximations, unless otherwise indicated the numerical values set forth in the specific examples are reported as precisely as possible. Any numerical value, however, inherently contains certain errors necessarily resulting from the standard deviation found in their respective testing measurements.

The methods and devices described herein will be further described by the following non-limiting examples, which are intended to be purely exemplary.

EXAMPLES

Organic PV devices having anode and cathode buffer layers adjacent to an anode and cathode, respectively, were fabricated. Devices were fabricated with the following structure: glass/anode/20 nm $MoO_3$/13 nm DPSQ/10 nm $C_{70}$/5 nm PTCBI/0.1 nm Ag/30 nm $MoO_3$/cathode, where the anode was either ITO (pre-coated) or 20 nm Ag, and the cathode consisted of 100 nm Ag, 20 nm Ag, or 40 nm sITO. FIG. 2 shows a schematic of the devices. Although $MoO_3$ typically has an electronegative lowest unoccupied molecular orbital (LUMO), the Ag nanocluster layer deposited on top of PTCBI has the effect of aligning the Fermi level of PTCBI and $MoO_3$. The result is efficient electron transport from PTCBI to $MoO_3$ to the cathode.

Devices were grown on either 100 nm thick layers of ITO pre-coated onto glass substrates or 20 nm thick layers of Ag on glass. Prior to deposition, the ITO or glass surface was cleaned in a surfactant and a series of solvents and then exposed to ultraviolet-ozone for 10 minutes before loading into a high vacuum chamber (base pressure $<10^{-7}$ Torr) where $MoO_3$ was thermally evaporated at ~0.1 nm/s.

Substrates were then transferred to a $N_2$ glovebox where DPSQ films were spin-coated from filtered 1.6 mg/ml solutions in chloroform. Substrates were again transferred into the high vacuum chamber for deposition of purified organics at 0.1 nm/s, followed by transfer back into the glovebox and exposure to saturated chlorophorm vapors for 10 minutes to create a favorable film morphology. After a transfer back to the vacuum chamber, a 0.1 nm Ag silver nanocluster layer and a $MoO_3$ transport layer were deposited.

The cathode material (Ag or ITO) was deposited through a shadow mask with an array of 1 mm diameter openings. Sputtered ITO (sITO) was deposited at 0.01 nm/s with 20 W DC power. Current density versus voltage (J-V) characteristics were measured in an ultra-pure $N_2$ ambient, in the dark and under simulated AM1.5G solar illumination from a filtered 300 W Xe lamp. Lamp intensity was varied using neutral density filters. Optical intensities were referenced using an NREL-calibrated Si detector, and photocurrent measurements were corrected for spectral mismatch.

Figures 3A, 3B:
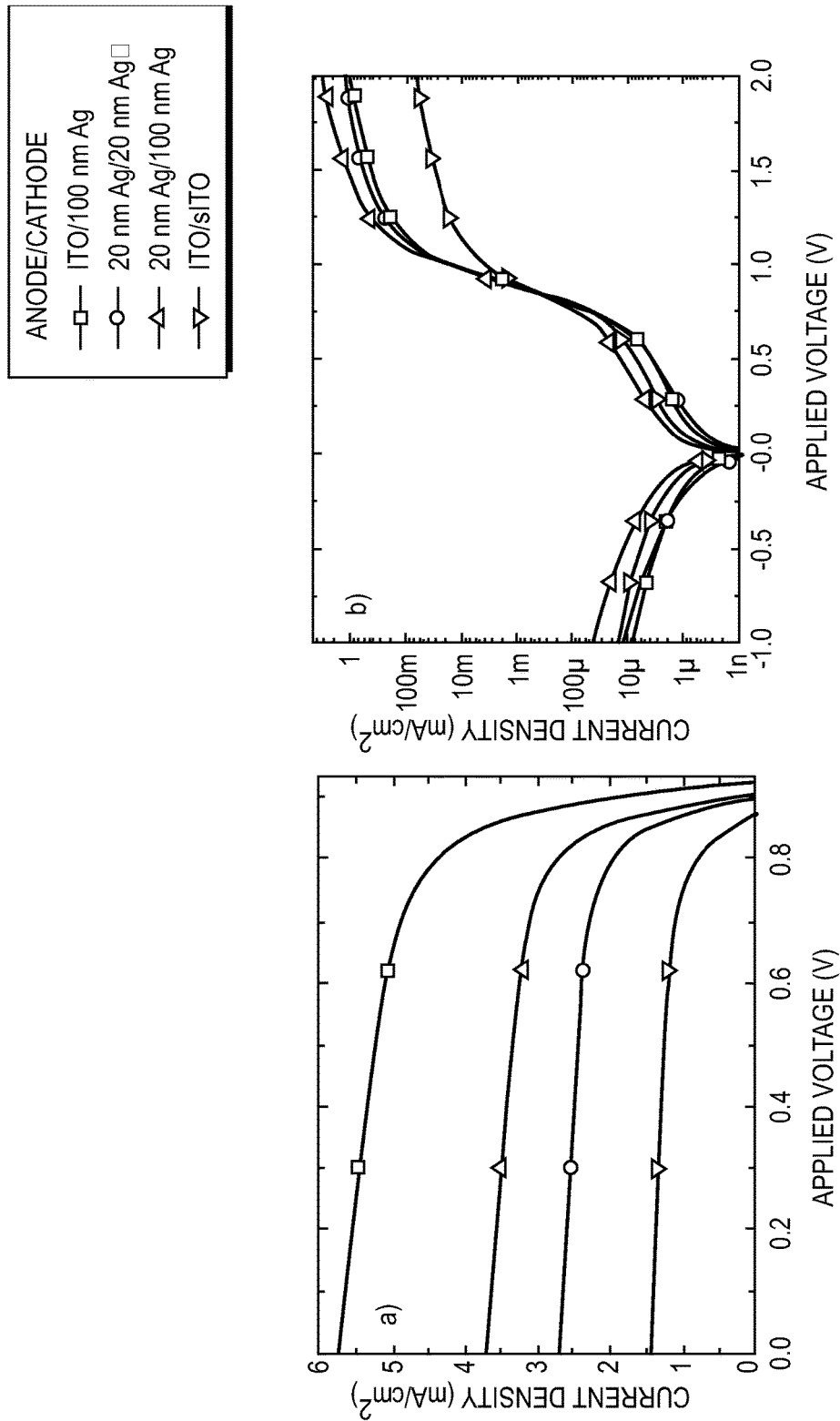
FIG. 3(a) shows a linear plot of the J-V characteristics of devices with various electrodes under one-sun simulated illumination.
FIG. 3(b) shows a semilog plot of the same devices in the dark.

Device characteristics under 1 sun AM1.5G simulated illumination and in the dark are shown in FIGS. 3(a) and 3(b), respectively, and performance is summarized in Table 1 as follows:

TABLE 1

Device performance at one sun illumination.

| Anode | Cathode | $J_{SC}$ (mA/cm$^2$) | $V_{OC}$ (V) | FF | PCE (%) | $R_S$ (Ω cm$^2$) |
|---|---|---|---|---|---|---|
| ITO | 100 nm Ag | 6.0 | 0.92 | 0.67 | 3.7 | 0.87 |
| 20 nm Ag | 20 nm Ag | 2.8 | 0.89 | 0.65 | 1.6 | 0.64 |
| 20 nm Ag | 100 nm Ag | 3.7 | 0.90 | 0.67 | 2.2 | 0.29 |
| ITO | sITO | 1.4 | 0.86 | 0.52 | 0.8 | 14.1 |

Figure 4:
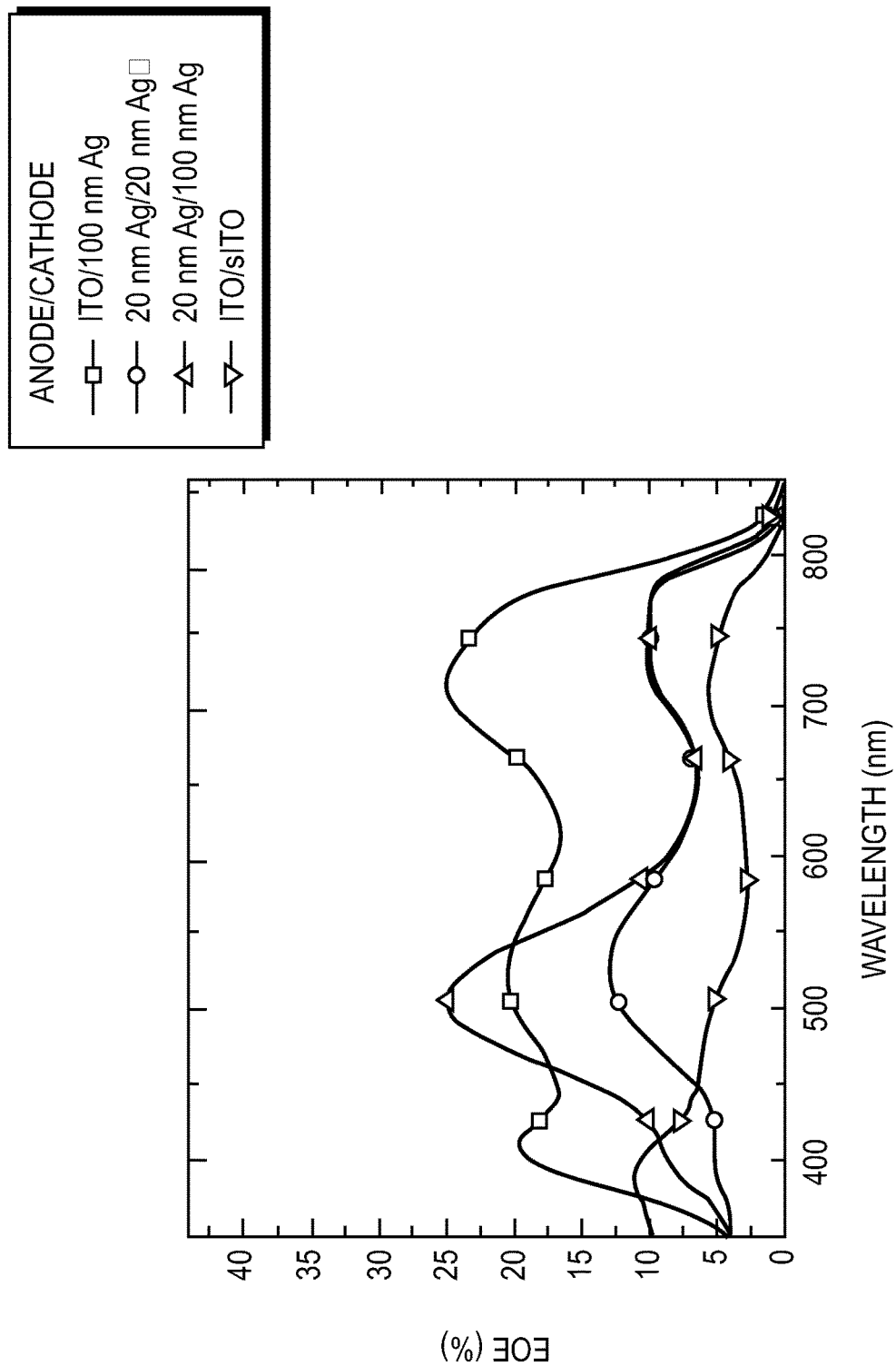
FIG. 4 shows external quantum efficiencies (EQEs) for devices with various electrodes.

The difference in short-circuit current ($J_{SC}$) can be attributed to the difference in reflectivity of the electrodes used. In the case of an ITO anode, reflectivity is low, leading to more light absorbed at the active layers. Using 20 nm Ag as the anode is more reflective, decreasing responsivity. For the cathode, using 100 nm Ag reflects light back though the active layers, further increasing responsivity, while 20 nm Ag and sITO are increasingly transparent, leading to lower responsivity. This transparency, however, can be advantageous when designing a semi-transparent organic PV. These differences in responsivity can also be seen in the external quantum efficiency data shown in FIG. 4. For the device with 20 nm Ag as the anode and 100 nm Ag as the cathode, the peak at 500 nm can be attributed to microcavity effects, which can be turned to enhance certain wavelengths.

Figure 5:
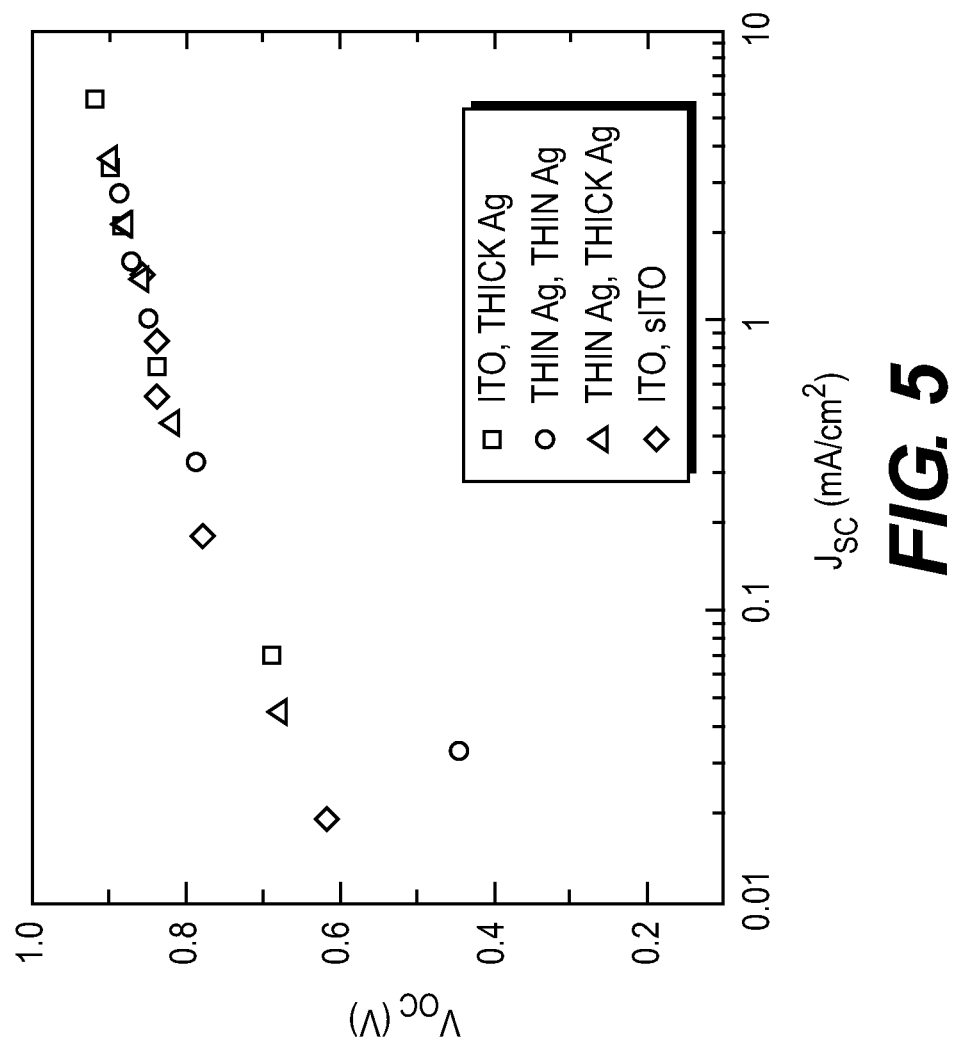
FIG. 5 shows a plot of $V_{OC}$ versus $J_{SC}$ for the devices with varying electrodes.

The difference in $V_{OC}$ between these four devices can be correlated to the difference in $J_{SC}$. There is a known relationship between $V_{OC}$ and $J_{SC}$:

$$qV_{OC} = \Delta E_{HL} + k_B T \ln(J_{SC}/J_C). \quad (1)$$

where q is the electron charge, $\Delta E_{HL}$ is the energy difference between the donor highest occupied molecular orbital (HOMO) and the donor LUMO, $k_b$ is Boltzmann's constant, T is the temperature and $J_0$ is the saturation dark current. It can be seen from Eq. 1 that there is a logarithmic dependence of $V_{OC}$ and $J_{SC}$. By plotting $V_{OC}$ as a function of $J_{SC}$ in FIG. 5, it is observed that the data for all four devices falls on a line. This indicates that all four devices are operating similarly, and the differences in $V_{OC}$ are only due to differences in the amount of light absorbed by the active layers.

By fitting the dark J-V data to the ideal diode equation, the series resistance ($R_S$) can be extracted for each device:

$$J = J_S \left[ \exp\left(\frac{q(V - JR_S)}{nk_b T}\right) - 1 \right]. \quad (2)$$

where $J_S$ is the reverse saturation current, n is the ideality factor, and T is the temperature. As shown in Table 1, devices with ITO and Ag have very low $R_S$, <1 Ωcm$^2$. For the device with sITO, it is much higher, with $R_S$=14.1 Ωcm$^2$. This is due to the fact that sITO is of lower quality than ITO (sheet resistance ~200Ω/☐ vs. 15Ω/☐), leading to increased $R_S$ and decreased FF for this device.

Although the present disclosure is described with respect to particular examples and embodiments, it is understood that the devices described herein are not limited to these examples and embodiments. The embodiments as claimed may therefore include variations from the particular examples and preferred embodiments described herein, as will be apparent to one of skill in the art.

What is claimed is:

1. An organic optoelectronic device comprising:
   two electrodes in superposed relation comprising an anode and a cathode;
   at least one donor material and at least one acceptor material located between the two electrodes forming a donor-acceptor heterojunction;
   an anode buffer layer adjacent to the anode and a cathode buffer layer adjacent to the cathode, wherein the anode buffer layer and the cathode buffer layer are independently chosen from transition metal oxides and conductive polymers; and
   an intermediate layer chosen from elementally pure metals and metal alloys composed of two or more elementally pure metals, wherein the intermediate layer is adjacent to the anode buffer layer and between the anode buffer layer and the at least one donor material, or wherein the intermediate layer is adjacent to the cathode buffer layer and between the cathode buffer layer and the at least one acceptor material,
   wherein when the intermediate layer is adjacent to the anode buffer layer, the intermediate layer is chosen to facilitate the transport of holes to the anode buffer layer, and
   when the intermediate layer is adjacent to the cathode buffer layer, the intermediate layer is chosen to facilitate the transport of electrons to the cathode buffer layer.

2. The device of claim 1, wherein the anode buffer layer and the cathode buffer layer are independently chosen from transition metal oxides.

3. The device of claim 1, wherein the transition metal oxides are $MoO_3$, $V_2O_5$, $WO_3$, $CrO_3$, $Co_3O_4$, NiO, ZnO, and $TiO_2$.

4. The device of claim 2, wherein the anode and cathode buffer layers comprise the same transition metal oxide.

5. The device of claim 4, wherein the same transition metal oxide is $MoO_3$.

6. The device of claim 1, wherein the intermediate layer is chosen from Ni, Ag, Au, Al, Mg, Pt, Pd, Cu, Ca, Ti, and In.

7. The device of claim 1, wherein the intermediate layer comprises metal nanoparticles, nanoclusters, or nanorods.

8. The device of claim 1, wherein the intermediate layer has a thickness of 5 nm or less.

9. The device of claim 1, wherein the intermediate layer has an average thickness of 1 nm or less.

10. The device of claim 1, wherein the intermediate layer is adjacent to the anode buffer layer and between the anode buffer layer and the at least one donor material, the device further comprising a second intermediate layer adjacent to the cathode buffer layer and between the cathode buffer layer and the at least one acceptor material, wherein the second intermediate layer is chosen to facilitate the transport of electrons to the cathode buffer layer.

11. The device of claim 1, further comprising an exciton blocking layer located between at least one of the anode and the donor material and the cathode and the acceptor material.

12. The device of claim 1, wherein the two electrodes are chosen from metals, metal substitutes, conducting oxides, conductive polymers, graphene, and carbon nanotubes.

13. The device of claim 12, wherein at least one of the two electrodes is transparent.

14. The device of claim 13, wherein the electrode opposing the transparent electrode is reflective.

15. The device of claim 13, wherein the electrode opposing the transparent electrode is at least semi-transparent.

16. The device of claim 12, wherein the two electrodes are at least semi-transparent.

17. The device of claim 11, wherein the at least one exciton blocking layer comprises a material chosen from BCP, BPhen, NTCDA, PTCBI, TPBi, Ru(acac)3, and Alq2 OPH.

18. An organic optoelectronic device comprising:
two electrodes in superposed relation comprising an anode and a cathode;
at least one donor material and at least one acceptor material located between the two electrodes forming a donor-acceptor heterojunction;
at least one buffer layer chosen from an anode buffer layer adjacent to the anode and a cathode buffer layer adjacent to the cathode, wherein the at least one buffer layer is independently chosen from transition metal oxides and conductive polymers; and
an intermediate layer chosen from elementally pure metals and metal alloys composed of two or more elementally pure metals, wherein the intermediate layer is adjacent to the anode buffer layer and between the anode buffer layer and the at least one donor material, or wherein the intermediate layer is adjacent to the cathode buffer layer and between the cathode buffer layer and the at least one acceptor material,
wherein when the intermediate layer is adjacent to the anode buffer layer, the intermediate layer is chosen to facilitate the transport of holes to the anode buffer layer, and
when the intermediate layer is adjacent to the cathode buffer layer, the intermediate layer is chosen to facilitate the transport of electrons to the cathode buffer layer.

19. The device of claim 18, wherein the intermediate layer is chosen from Ni, Ag, Au, Al, Mg, Pt, Pd, Cu, Ca, Ti, and In.

20. The device of claim 18, wherein the intermediate layer comprises metal nanoparticles, nanoclusters, or nanorods.

* * * * *